(12) United States Patent
Johnson

(10) Patent No.: US 11,258,412 B2
(45) Date of Patent: Feb. 22, 2022

(54) RADIO FREQUENCY (RF) DEVICE HAVING TUNABLE RF POWER AMPLIFIER AND ASSOCIATED METHODS

(71) Applicant: EAGLE TECHNOLOGY, LLC, Melbourne, FL (US)

(72) Inventor: William Joel Dietmar Johnson, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 16/885,344

(22) Filed: May 28, 2020

(65) Prior Publication Data

US 2021/0376804 A1    Dec. 2, 2021

(51) Int. Cl.
| | | |
|---|---|---|
| H03F 3/191 | (2006.01) | |
| H03F 3/24 | (2006.01) | |
| H03F 3/195 | (2006.01) | |
| H04B 1/04 | (2006.01) | |

(52) U.S. Cl.
CPC ............ *H03F 3/245* (2013.01); *H03F 3/195* (2013.01); *H04B 1/0458* (2013.01); *H03F 2200/318* (2013.01); *H03F 2200/451* (2013.01)

(58) Field of Classification Search
CPC ..................................................... H03F 3/191
USPC ................................................ 330/302, 305
See application file for complete search history.

(56) References Cited

U.S. PATENT DOCUMENTS

| | | | |
|---|---|---|---|
| 7,221,327 B2 | 5/2007 | Toncich | |
| 7,667,542 B2 * | 2/2010 | Kasha | ................. H03F 3/45183 330/284 |
| 8,073,419 B2 * | 12/2011 | Kuo | ..................... H04B 1/0053 455/334 |
| 8,981,850 B2 | 3/2015 | Boumaiza et al. | |
| 9,024,709 B2 | 5/2015 | Joshi et al. | |
| 9,935,349 B2 | 4/2018 | Johnson et al. | |

(Continued)

FOREIGN PATENT DOCUMENTS

| | | |
|---|---|---|
| EP | 1579465 | 5/2016 |
| WO | 2003058656 | 7/2003 |

(Continued)

OTHER PUBLICATIONS

Galatro et al., "Frequency Scalable Power Control and Active Tuning for Sub-THz Large-Signal Measurements," Microwave Journal, vol. 62 Issue 2, Feb. 2020, pp. 66-80. (Abstract Only).

(Continued)

*Primary Examiner* — Henry Choe
(74) *Attorney, Agent, or Firm* — Allen, Dyer, Doppelt, + Gilchrist, P.A.

(57) ABSTRACT

A radio frequency (RF) device may include an RF signal source having a selectable frequency, an RF antenna, and an RF power amplifier module coupled between the RF signal source and the RF antenna. The RF power amplifier module may include at least one input tunable cavity impedance matching device, at least one output tunable cavity impedance matching device, and a power amplifier device connected therebetween. A controller may select the selectable frequency of the RF signal source, tune the at least one input tunable cavity impedance matching device based upon the selected frequency, and tune the at least one output tunable cavity impedance matching device based upon the selected frequency.

24 Claims, 8 Drawing Sheets

(56) References Cited

U.S. PATENT DOCUMENTS

| | | |
|---|---|---|
| 10,122,478 B2 | 11/2018 | Khater et al. |
| 2009/0323854 A1 | 12/2009 | Bishop et al. |
| 2012/0075023 A1 | 3/2012 | Guo |
| 2018/0331666 A1 | 11/2018 | Johnson et al. |
| 2021/0175866 A1* | 6/2021 | Li .......................... H03F 3/2171 |

FOREIGN PATENT DOCUMENTS

| | | |
|---|---|---|
| WO | 2011077247 | 6/2011 |
| WO | 2016034893 | 3/2016 |
| WO | 2017074229 | 5/2017 |

OTHER PUBLICATIONS

COMSOL, "Tunable Evanescent Mode Cavity Filter Using a Piezo Actuator," Created in COMSOL Multiphysics 5.5, model is licensed under COMSOL Software License Agreement 5.5, retrieved from the Internet: https://www.comsol.com/model/tunable-evanescent-mode-cavity-filter-using-a-piezo-actuator-12619 on Mar. 18, 2020, pp. 1-34.

Arif et al., All-silicon Technology for High-Q Evanescent Mode Cavity Tunable Resonators and Filters, Purdue University, Purdue e-Pubs, Brick and NCN Publications, Paper 1638, Jun. 2014, pp. 1-14.

\* cited by examiner

RADIO FREQUENCY (RF) DEVICE HAVING TUNABLE RF POWER AMPLIFIER AND ASSOCIATED METHODS

FIELD OF THE INVENTION

The present invention relates to the field of radio frequency (RF) devices, and, more particularly, to RE devices having RE power amplifier modules.

BACKGROUND OF THE INVENTION

Many radio frequency (RF) devices incorporate RE power amplifiers that operate in a narrow frequency band. This may be a concern in some RF devices, such as portable or handheld RE communication devices, because users may want both wideband frequency operation and high efficiency without sacrificing power efficiency and battery life. Because many RF devices are portable, battery efficiency is important. As the operational bandwidth is increased in power amplifiers, however, simultaneous impedance matching and high efficiency become more difficult to achieve because obtaining these simultaneous RF conditions are most often in conflict with one another.

Some RF devices incorporate impedance matching circuits that maintain the impedance matching coefficient during device operation across a range of power amplifier operations. For example, some RF devices employ impedance matching circuitry having multiple transistors, diodes or discrete power amplifiers that are switched into and out of operation to maintain an impedance coefficient. Although these devices may incorporate wide bandwidth power amplifier systems that maintain a proper impedance reflection coefficient wherein the coefficient varies in order to maintain high efficiency, the multiple discrete components add bulk, increase power requirements, and require a controller to switch among the different components.

Other impedance matching circuits provide tunability with variable magnetics. For example, U.S. Pat. No. 7,221,327 discloses a tunable matching circuit operable at RF frequencies where a capacitive element and inductive element are arranged in a matching circuit with an impedance and a ferroelectric material is positioned to adjust the value and change the impedance of the matching circuit. A controller is electrically connected to the ferroelectric material and configured to transmit a control signal to vary its permittivity and permeability. Varying the permittivity varies the circuit capacitance as the more dominating effect on the circuit, while varying the permeability varies the circuit inductance, thus allowing variable (tunable) impedance matching.

Some RF devices incorporate tunable evanescent-mode cavity filters that are suitable for band selection and image rejection at the device front end, for example, as disclosed in U.S. Pat. No. 9,024,709, assigned to Purdue Research Foundation. This cavity filter changes its center frequency of the cavities by using a piezoelectric actuator separated by a gap over a capacitive tuning post. The gap is varied between the capacitive post and actuator of both first and second evanescent-mode cavities to vary the center frequency of the filter. The first and second evanescent-mode cavities are coupled to each other and operate together. The device has a wide range of tuning from a first frequency range of about 1 to 3 GHz to a second frequency range of about 4 to 8 GHz, and includes a quality factor above 200. This cavity filter has been applied at the front end of an RF device between a mixer and power amplifier as a narrowband filter to filter noise and harmonics that exist on the transmission line between the mixer and the power amplifier.

Further improvements have been made to this tunable evanescent-mode cavity filter by incorporating a monitoring cavity such as disclosed in U.S. Pat. No. 10,122,478, also assigned to Purdue Research Foundation. The monitoring cavity is adjacent and opposite the evanescent-mode cavity filter and monitors the frequency of the tunable filter by measuring the number of cycles in a natural response of the filter as excited by an electric pulse. The use of a tunable filter and monitoring circuit in an opposing configuration may require complex manufacturing, and that design may be limited to specific filter applications, such as front-end filters for receivers and transmitters in RF devices that operate between a mixer and amplifier. Although these cavity filters and associated monitoring circuits provide a range of tunable filtering in the front end of an RF device, those filters have not been implemented in that configuration for impedance matching.

SUMMARY OF THE INVENTION

A radio frequency (RE) device may include an RF signal source having a selectable frequency, an RF antenna, and an RE power amplifier module coupled between the RE signal source and the RF antenna. The RF power amplifier module may comprise at least one input tunable cavity impedance matching device, at least one output tunable cavity impedance matching device, and a power amplifier device having an input coupled to the at least one input tunable cavity impedance matching device, and having an output coupled to the at least one output tunable cavity impedance matching device. A controller may be configured to select the selectable frequency of the RE signal source, tune the at least one input tunable cavity impedance matching device based upon the selected frequency, and tune the at least one output tunable cavity impedance matching device based upon the selected frequency.

The RF power amplifier module may comprise a substrate and at least one conductive layer thereon. The power amplifier device may be mounted on the at least one conductive layer. The at least one input tunable cavity impedance matching device may comprise first and second input tunable cavity impedance matching devices, and the controller may be configured to tune the first input tunable cavity impedance matching device to a fundamental frequency of the selected frequency, and tune the second input tunable cavity impedance matching device to an integer multiple of the fundamental frequency of the selected frequency. The tandem tunable cavity impedance matching devices may be arranged in series such that the second input tunable cavity impedance matching device being closest to the power amplifier device.

The at least one output tunable cavity impedance matching device may comprise first and second output tunable cavity impedance matching devices, and the controller is configured to tune the second output tunable cavity impedance matching device to a fundamental frequency of the selected frequency, and tune the second output tunable cavity impedance matching device to an integer multiple of the fundamental frequency of the selected frequency. The first and second output tunable cavity impedance matching devices may be arranged in series with the second output tunable cavity impedance matching device being closest to the power amplifier device. The at least one input tunable cavity impedance matching device may be voltage tunable, and the at least one output tunable cavity impedance matching device may be voltage tunable. At least one input monitoring cavity device may be coupled to the at least one input tunable cavity impedance matching device. At least one output monitoring cavity device may be coupled to the at least one output tunable cavity impedance matching device.

In an example, a radio frequency (RF) power amplifier module may be coupled between an RF signal source having a selectable frequency and an RF antenna. The RF power amplifier module may comprise at least one input tunable cavity impedance matching device to be tuned based upon the selected frequency of the RF signal source, at least one output tunable cavity impedance matching device to be tuned based upon the selected frequency of the RF signal source, and a power amplifier device having an input coupled to the at least one input tunable cavity impedance matching device, and having an output coupled to the at least one output tunable cavity impedance matching device.

Another aspect is directed to a method of operating a radio frequency (RF) device comprising an RF signal source having a selectable frequency, an RF antenna, and an RF power amplifier module coupled therebetween. The RF power amplifier module may comprise at least one input tunable cavity impedance matching device, at least one output tunable cavity impedance matching device, and a power amplifier device coupled between the at least one input cavity impedance matching device and the at least one output tunable cavity impedance matching device. The method includes operating a controller to select a selectable frequency of the RF signal source, tune the at least one input tunable cavity impedance matching device based upon the selected frequency, and tune the at least one output tunable cavity impedance matching device based upon the selected frequency.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout, and prime notation is used to indicate similar elements in different embodiments.

Figure 1:
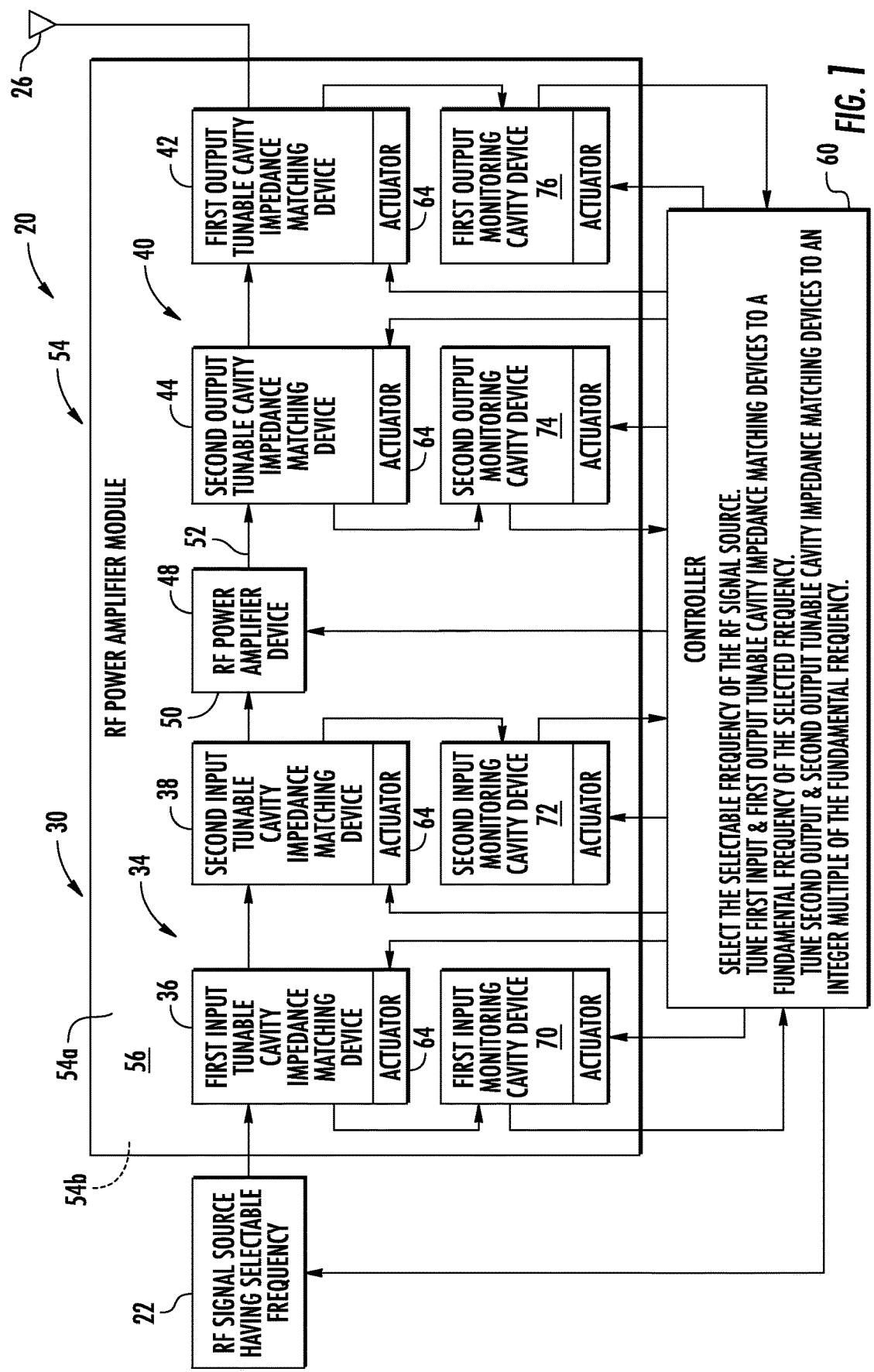
FIG. 1 is a block diagram of the radio frequency (RF) device according to an example.

Referring now to FIG. 1, there is illustrated at 20 the radio frequency (RF) device that includes an RF signal source 22 having a selectable frequency and an RF antenna 26. An RF power amplifier module is indicated generally at 30 and coupled between the RF signal source 22 and the RF antenna 26. The RF power amplifier module 30 includes at least one input tunable cavity impedance matching device indicated generally at 34, and includes in this example, first and second input tunable cavity impedance matching devices 36, 38. At least one output tunable cavity impedance matching device is indicated generally at 40, and includes in this example, first and second output tunable cavity impedance matching devices 42, 44. An RF power amplifier device 48 has an input 50 coupled to the second input tunable cavity impedance matching device 38 and an output 52 coupled to the second output tunable cavity impedance matching device 44. The power amplifier device 48 may be formed from different devices, but in this example as described, may be formed as a discrete transistor circuit, such as a HFET circuit designed for specific power amplifier applications.

The RF power amplifier module 30 includes a substrate 54 on which the input and output tunable impedance matching devices 34, 40 are formed. The substrate 54 includes at least one conductive layer thereon, and in this example, a copper layer 56 on both the top 54a and bottom 54b of the substrate, forming a structure similar to a circuit card assembly. The substrate 54 may be formed from a thermoset microwave material with the copper layer 56 on the opposing top and bottom surfaces 54a, 54b. An example thermoset microwave substrate or laminate is a Rogers TMM3 microwave substrate with double-sided copper. The power amplifier device 48 is mounted on the at least one conductive layer 56, in this example, the top surface 54a.

The RF device 20 includes a controller 60 that is configured to select a selectable frequency of the RF signal source 22 and tune the at least one input tunable cavity impedance matching device 34 based upon the selected frequency and tune the at least one output tunable cavity impedance matching device 40 based upon the selected frequency and provide impedance matching for each frequency over a range of defined frequencies, such as 1 GHz to 6 GHz and have a tuning range of 1:6 as a non-limiting example. The RF device 20 ensures impedance matching at a selected frequency for the power amplifier device 48, and may be formed as a circuit card assembly having the microwave tunable cavities. The controller 60 may be mounted on the substrate 54, or mounted separate from the substrate, such as mounted within a housing that supports the substrate as a circuit card assembly in the RF device 20, e.g., a radio device.

In the illustrated example of the RF device 20 having first and second input tunable cavity impedance matching devices 36, 38 and first and second output tunable cavity impedance matching devices 42, 44, the controller 60 may be configured to tune the first input tunable cavity impedance matching device to a fundamental frequency of the selected frequency selected at the RF signal source 22 and tune the second input tunable cavity impedance matching device 38 to an integer multiple of the fundamental frequency of the selected frequency. Likewise, the controller 60 may be configured to tune the first output tunable cavity impedance matching device 42 to a fundamental frequency of the selected frequency, and tune the second output tunable cavity impedance matching device 44 to an integer multiple of the fundamental frequency of the selected frequency. For example, the first input and output tunable cavity impedance matching devices 36, 42 may be tuned to operate at 1 GHz, and the second input and output tunable cavity impedance matching devices 38, 44 may be tuned to operate at 2 GHz. Each of the first and second input and output tunable cavity matching devices 36, 38, 42, 44 may be independently tunable via a piezoelectric bending actuator 64 incorporated at each cavity device as explained in greater detail below. It should be understood that the RF device 20 may include only a single tunable cavity 34 at the input and a single tunable cavity 40 at the output. Also, a single tunable cavity may be placed in series with a second but non-coupled cavity for impedance matching at either the input or output to have more control over the tuning of the fundamental and the second harmonic.

Both first and second input tunable cavity impedance devices 36, 38 are arranged in series as illustrated in FIG. 1, and the second input tunable cavity impedance matching device 38 is positioned closest to the power amplifier device 48. Both first and second output tunable cavity impedance matching devices 42, 44 are arranged in series, and the second output tunable cavity impedance matching devices 44 is positioned closest to the power amplifier device 48. Both first and second input tunable cavity impedance matching devices 36, 38 include respective first and second input monitoring cavity devices 70, 72 coupled thereto that monitor the resonant frequencies of the respective adjacent input tunable cavity impedance matching devices. Both the first and second output tunable cavity impedance matching devices 42, 44 include respective first and second output monitoring cavity devices 74, 76 coupled thereto that also monitor the resonant frequencies of the respective adjacent output tunable cavity impedance matching devices.

Figure 2:
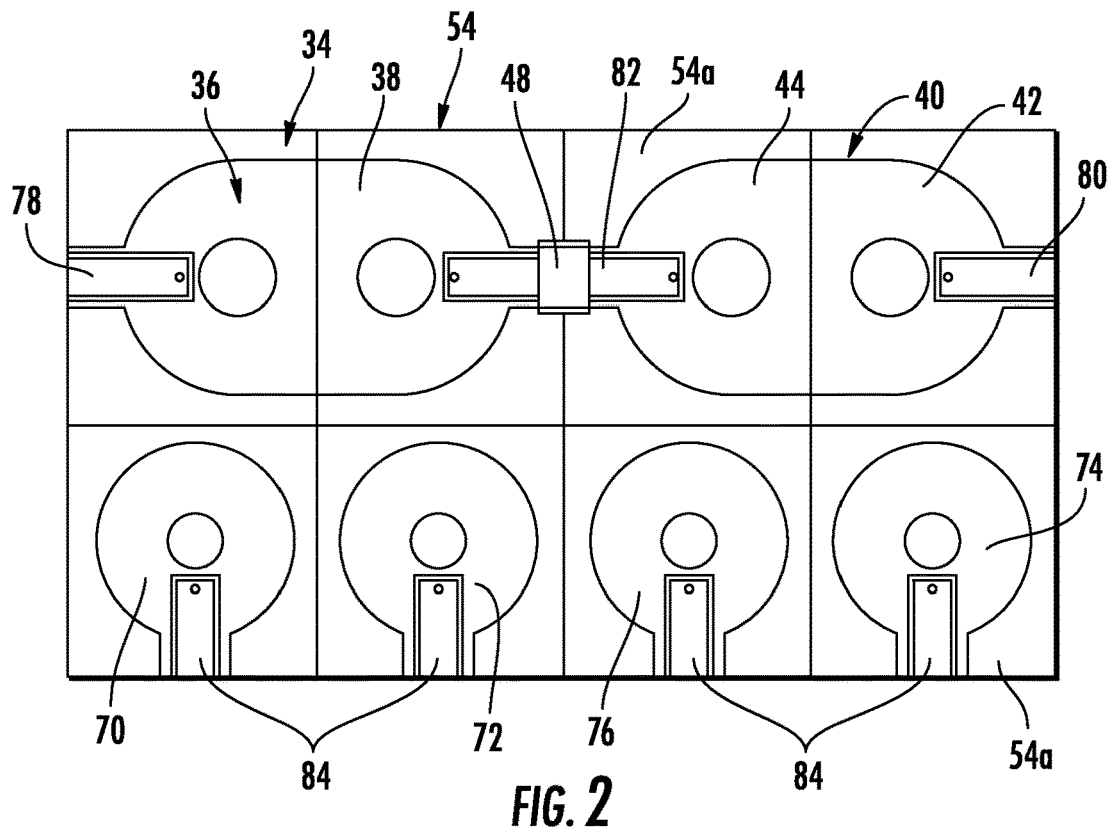
FIG. 2 is a top plan schematic view of a portion of the RF power amplifier module used in the RF device of FIG. 1.
Figure 3:
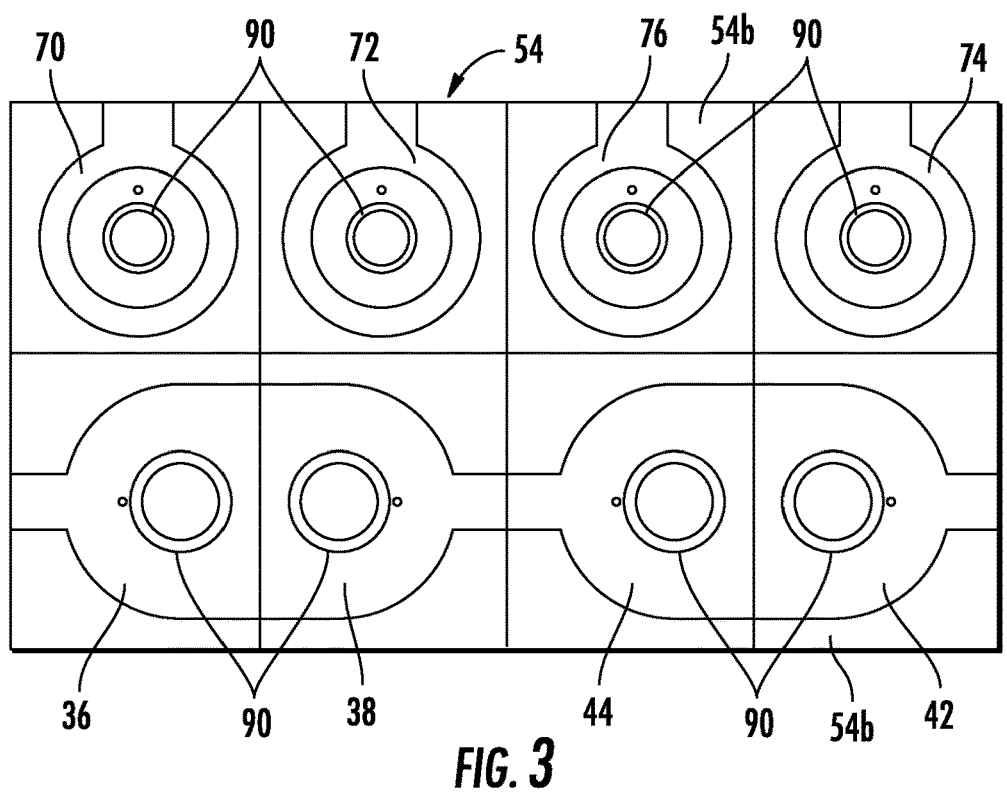
FIG. 3 is a bottom plan schematic view of the RF power amplifier module shown in FIG. 2.

Referring now additionally to FIGS. 2 and 3, there are illustrated respective schematic representations of the top and bottom surfaces 54a, 54b of the substrate 54, which in this example includes the formed cavities 36, 38, 42, 44, 70, 72, 74, 76, and showing diagrammatically in FIG. 2 the power amplifier device 48 as a discrete transistor device connected between the second input tunable cavity impedance matching device 38 and second output tunable cavity impedance matching device 44. An input transmission line 78 is formed on the top surface 54a of the substrate 54 and etched via the copper layer 56 and connects the RF signal source 22 and the first input tunable cavity impedance matching device 36. An output transmission line 80 connects the first output tunable cavity impedance matching device 42 with the RF antenna 26. SMA connectors (not shown) may be mounted on the top surface 54a of the substrate 54 at the input and output transmission lines 78, 80 and connect to the respective RF signal source 22 and the RF antenna 26. A power device transmission line 82 is formed on the top surface 54a of the substrate 56 and connected between the second input and output tunable cavity impedance matching devices 38, 44. The power amplifier device 48 may be mounted on the power device transmission line 82 in a split section between the devices 38, 44.

Monitoring device transmission lines 82 are formed on the top surface 54a of the substrate 54 and connect the monitoring cavity devices 70, 72, 74, 76 to the controller 60, such as via SMA connectors (not shown) to transmit the monitored resonant frequencies indicative of their monitoring function for respective first and second input and output tunable cavity impedance matching devices 36, 38, 42, 44, such that the controller may make finite adjustments to the tunable cavities via the piezoelectric bending cavities 64. Each monitoring cavity device 70, 72, 74, 76 is constructed similar to the respective first and second input and output tunable cavity impedance matching devices 36, 38, 42, 44 and configured to operate at the same resonant frequency as the adjacent cavity.

As will be explained in greater detail below, some of the signal energy from the first and second input and output tunable cavity impedance matching devices 36, 38, 42, 44 passes into the monitoring cavity devices 70, 72, 74, 76 via signal lines that may be traced or etched and by the close proximity of the various cavities. In an example of the size of the RF device 20 in this example of 1 to 3 GHz operation, the substrate 54 may be about 90 to 110 millimeters long, and about 50 to 65 millimeters wide and about 2.3 to about 2.7 millimeters in thickness, forming a circuit card assembly adapted for insertion within a housing such as radio housing. A heat sink (not shown) may be placed directly below the power amplifier device 48, such as the transistor, and between each of the cavities 36, 38, 42, 44, 70, 72, 74, 76.

Figure 4:
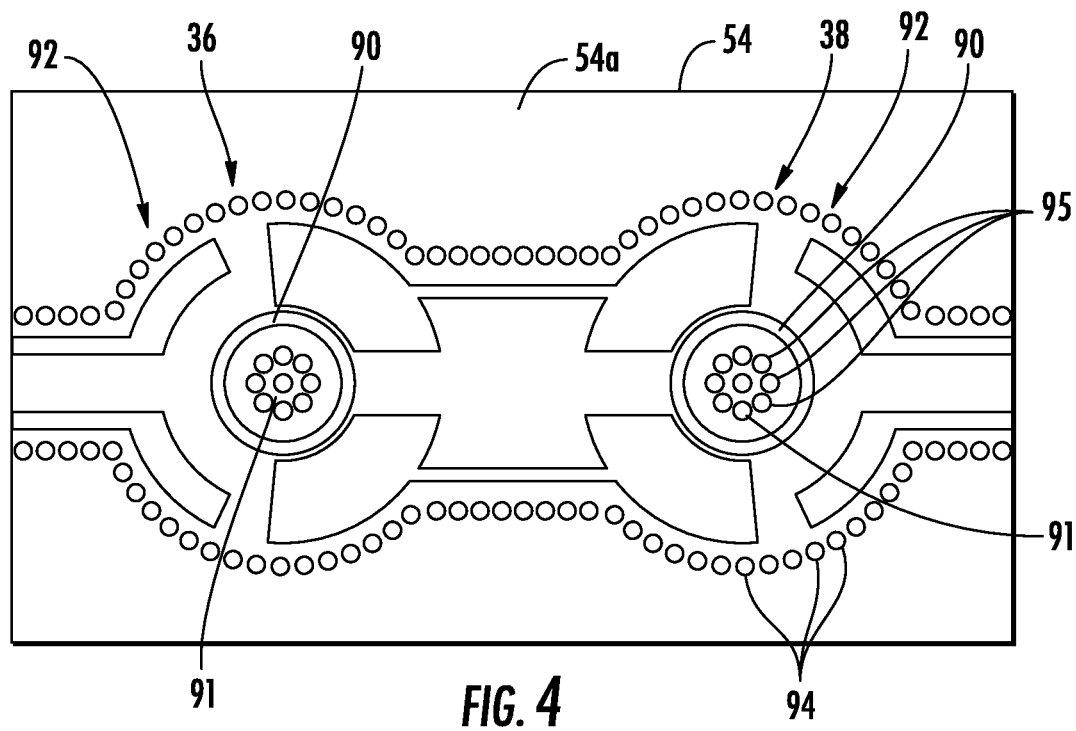
FIG. 4 is a more detailed top plan schematic view of a section of the RF power amplifier module of FIG. 2 showing first and second input tunable cavity impedance matching devices.
Figure 5:
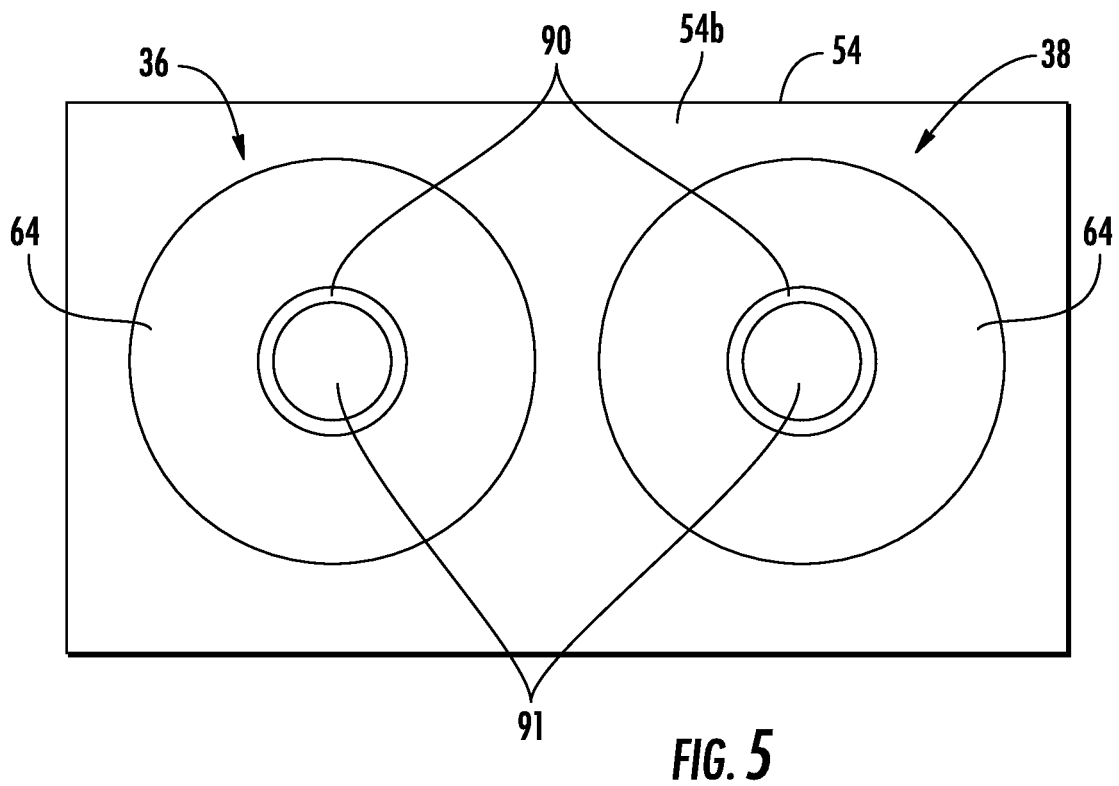
FIG. 5 is a bottom plan schematic view of the RF power amplifier module of FIG. 4 showing the piezoelectric bending actuators.

As perhaps best shown in the bottom view of FIG. 3, each cavity 36, 38, 42, 44, 70, 72, 74, 76 includes a ring 90 milled out on the bottom surface 54a of the substrate 54 and its copper layer 56, and creates a gap between a central capacitive post 91 that operates as a tuning post for the respective cavity in which it is formed and an outer ground formed from the copper layer 56 on the bottom of the substrate. An outer cavity wall 92 is formed from an outer set of drilled vias 94 and centrally drilled vias 95 are configured to form the central capacitive post 91 (FIGS. 4 and 5).

In an example, the input frequency for the RF device 20 varies depending on the power amplifier device 48 requirements and the impedance matching necessary for the power amplifier device operation. As noted before, an example frequency could be 1 GHz as the frequency present in the first input tunable cavity impedance matching device 36, while the second input tunable cavity impedance matching device 38 has a frequency that is integer multiple of the fundamental frequency of that selected frequency, which in this case may be double at 2 GHz. It is possible that the second input tunable cavity impedance matching device 38 could be at a frequency that is a greater integer multiple of the fundamental frequency of that selected frequency than double, and in this example, could be about 3 GHz, 4 GHz, or 5 GHz. Likewise, the second output tunable cavity impedance matching device 44 may be an integer multiple of that fundamental frequency example of 1 GHz, which is the frequency for the first output tunable cavity impedance matching device 42, and thus, the second output tunable cavity impedance matching device may be 2 GHz, or an integer multiple of that fundamental frequency, such as 3

GHz, 4 GHz, or 5 GHz. It is possible to have different numbers of input and output tunable cavity impedance matching devices 34, 40 and a larger number of such devices may impart greater efficiency to the RF device 20. For example, a minimum tuning function is accomplished with only one input and one output tunable cavity impedance matching device 34, 40. However, efficiency in operation is increased with multiple cavities that are integer multiples of a fundamental frequency for impedance matching as long as the input and output matches one frequency and impedance matching is maintained.

Referring again to FIGS. 4 and 5, there are illustrated top and bottom plan views of a portion of the substrate 54 and showing greater details of the construction of the first input and output tunable cavity impedance matching devices 34, 40, and in this example, the first and second input tunable cavity impedance matching devices 36, 38. The first and second input tunable cavity impedance matching devices 36, 38 are similar in construction to that of the first and second output tunable cavity impedance matching devices 42, 44 and the description as follows applies equally to the construction of both. Similar details of construction also apply to the first and second input and output monitoring cavity devices 70, 72, 74, 76, which are configured to tune and operate at the same resonant frequency to the respective adjacent cavity.

Figure 6:
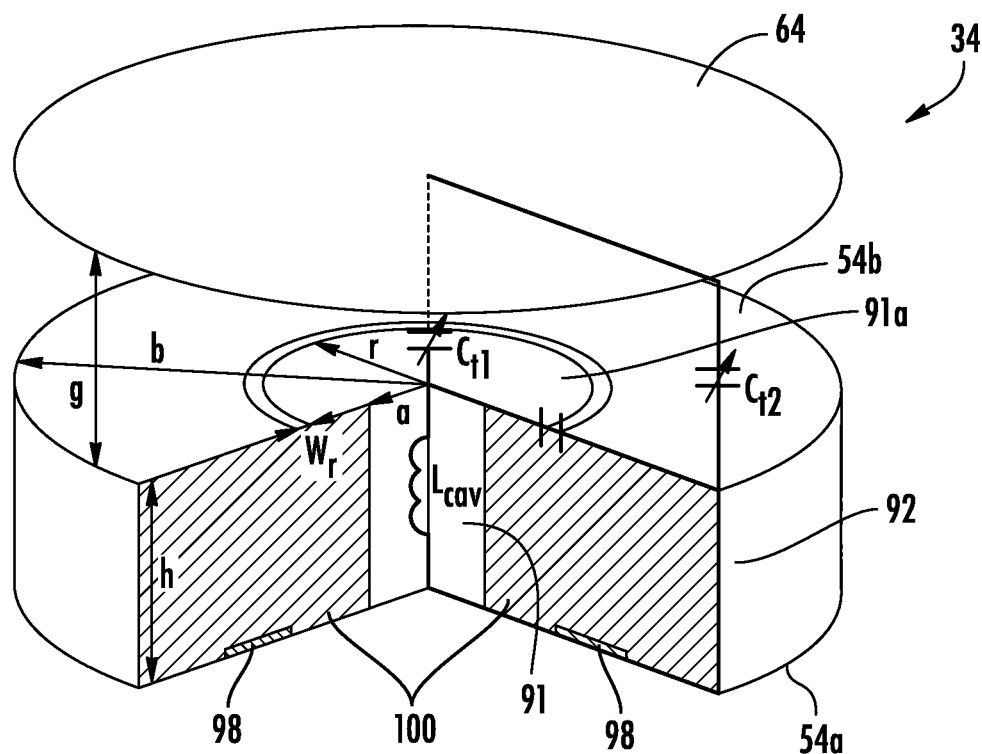
FIG. 6 is a fragmentary schematic view of an input tunable cavity impedance matching device.
Figure 7:
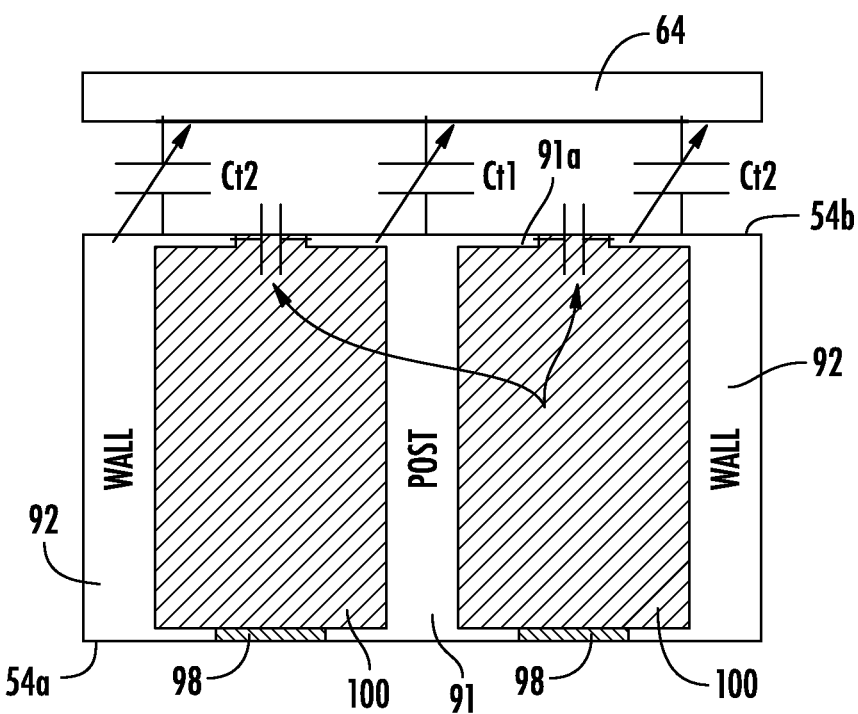
FIG. 7 is a schematic section view of the input tunable cavity impedance matching device shown in FIG. 6.

As illustrated, the outer cavity wall 92 in this example is formed from drilled vias 94 in the substrate 54 to form the outer cavity wall, and the centrally drilled vias 95 form the central capacitive post 91. The outer cavity wall 92 and central capacitive post 91 are best shown in the inverted isometric view of FIG. 6, and the inverted sectional view of FIG. 7, illustrating for purposes of description only a single input tunable cavity impedance matching device 34. The transmission lines 78, 80, 82 are formed on the top surface 54a of the substrate 54 and in this example, as milled sections on the copper layer 56 between the drilled vias 94 and extending around the centrally drilled vias 95 and ring 90. The power device transmission line 82 is formed as parallel section lines on the top surface 54a of the substrate 54 and milled on the copper layer 56 to form an interresonator coupling structure with formed coupling apertures 98 as best shown in FIGS. 6 and 7, which are inverted views to show in better detail the piezoelectric bending actuator 64. Tuning of the respective first and second input tunable cavity impedance matching devices 36, 38 is via the metallized piezoelectric bending actuators 64 as shown in the plan view and schematically in the bottom view (FIG. 5), with each cavity including its own piezoelectric bending actuator. The rings 90 milled out of the bottom 54b create a gap between the capacitive post 91 and an outer ground shown in the example of a single tunable cavity impedance matching device in FIGS. 6 and 7.

The outer cavity wall 92 and central capacitive post 91 function with the piezoelectric bending actuator 64, which imparts a capacitance as it bends via a voltage applied from the controller 60 between the piezoelectric bending actuator and a dielectric 100 portion of the substrate 54 and vias 94, 95 that define the cavity wall 92 and capacitive post 91. The capacitance values for Ct1 and Ct2 are shown schematically in FIGS. 6 and 7 and are illustrated as variable capacitance values because the capacitance values imparted between the piezoelectric bending actuator 64 at the central capacitive post 91 and the cavity wall 92 vary depending on the varying voltage applied from the controller 60 onto the piezoelectric bending actuator 64.

The piezoelectric bending actuator 64 may be formed as a tuning disc structure over a cavity 34 and include a thin copper tuning layer applied onto the piezoelectric material that imparts capacitance with the cavity. An imparted inductance Lcav is formed within the cavity 34 at the central capacitive post 91. The ring 90 is illustrated having a distance from the center of the cavity 34 with dimension "r" and a ring width "Wr" to impart a ring capacitance Cr. The ring 90 forms an enlarged circular disc section 91a at the bottom 54b of the substrate 54 that imparts a varying capacitance at the capacitive post 91 as the controller 60 imparts the varying voltage to the piezoelectric bending actuator 64.

The capacitance values and inductance values as schematically shown in FIGS. 6 and 7 vary, thus imparting the desired tuning into the respective tunable cavity impedance matching device 34, which is monitored by the respective adjacent monitoring cavity 70 to provide feedback to the controller 60 as to the resonant frequency within the cavity and whether adjustments should be made in the tuning of the cavity to reach the desired resonant frequency tuning. As noted before, the first and second input monitoring cavity devices 70, 72 and first and second output monitoring cavity devices 74, 76 are of similar construction and dimension similar to their respective first and second input and output tunable cavity impedance matching devices 36, 38, 42, 44 and thus configured to operate at the same resonant frequency allowing the monitoring function.

The spacing between the piezoelectric bending actuator 64 and enlarged section 91a of the central capacitive post 91 and cavity wall 92 is defined by the dimension "g," which can range depending on the specific design, but usually is a few millimeters. The radius of the central capacitive post 91 is defined by dimension "a," which is about 1 millimeter in this example, and the radius of the top section 91a of the central capacitive post 91 is defined by the radius "r," which can range from about 0.6 to 1.6 millimeters in this example. The ring 90 thickness Wr can be a fraction of a millimeter or higher. The outer radius of the cavity is defined by "b," and in this example, may be about 6 to 10 millimeters. The thickness "h" of the cavity may vary from 2.3 to 2.7 millimeters of thickness depending on applications. These dimensions may vary depending on the RF device 20 requirements and function and type of power amplifier device 48, but are configured for the respective frequency of operation based on the range for the RF signal source 22, e.g., the range such as 1 to 3 GHz in this example.

The cavity structure as described relative to FIGS. 6 and 7 is applied to the structure of the input and output tunable cavity impedance matching devices 36, 38, 42, 44, and the first and second input and output monitoring cavity devices 70, 72, 74, 76. Example cavity designs that may be used are also the tunable evanescent mode resonator cavity designs disclosed in the '709 patent, the disclosure which is hereby incorporated by reference in its entirety. The various cavities may be formed as evanescent mode resonator cavity designs as in the '709 patent or operate outside that range and be non-evanescent in mode. The substrate 54 could be formed as a TMM substrate and the vias 94, 95 to form the central capacitive post 91 and outer cavity wall 92, which may include the milled sections of the substrate, may be formed followed by copper plating both top and bottom surfaces 54a, 54b of the substrate.

Figure 8:
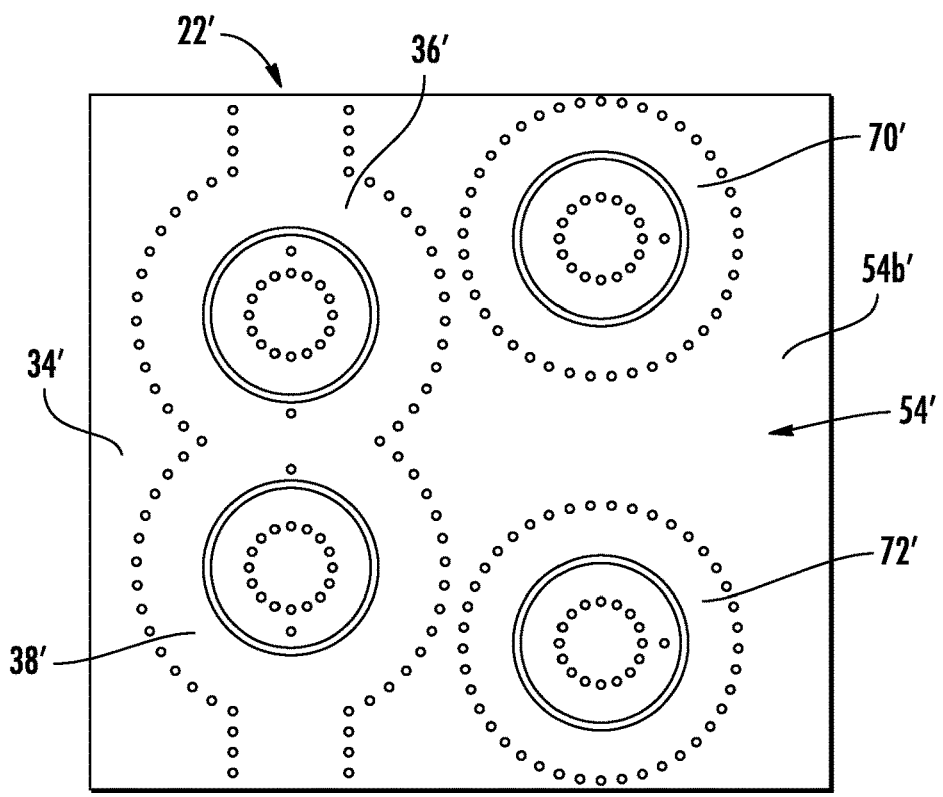
FIG. 8 is a plan view of a portion of the RF power amplifier module in a second embodiment.
Figure 9:
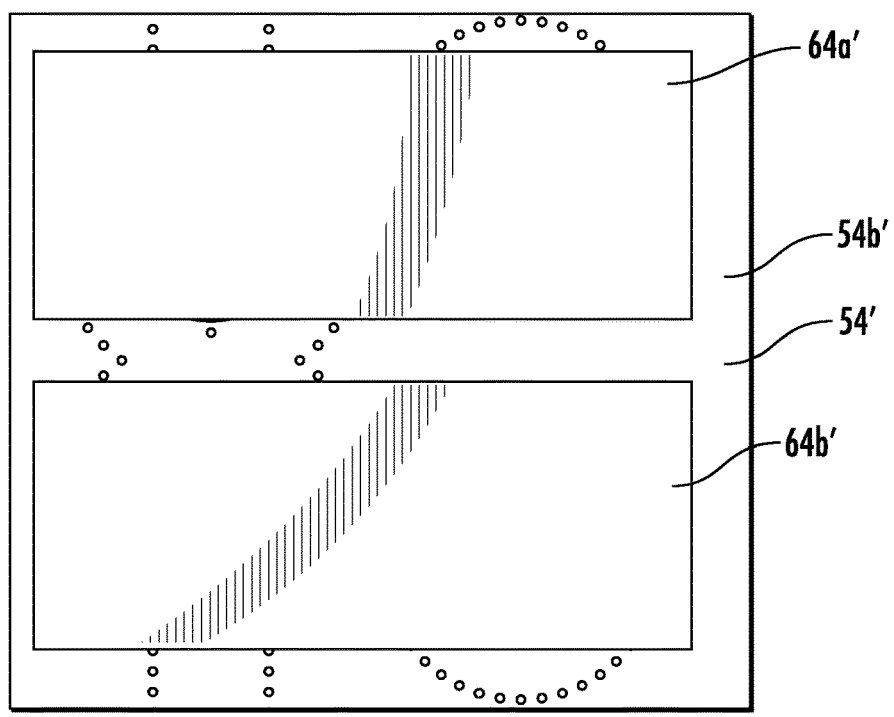
FIG. 9 is a plan view of the RF amplifier module of FIG. 8 showing use of a single piezoelectric bending actuator for an input tunable cavity impedance matching device and its respective monitoring cavity device.
Figure 10:
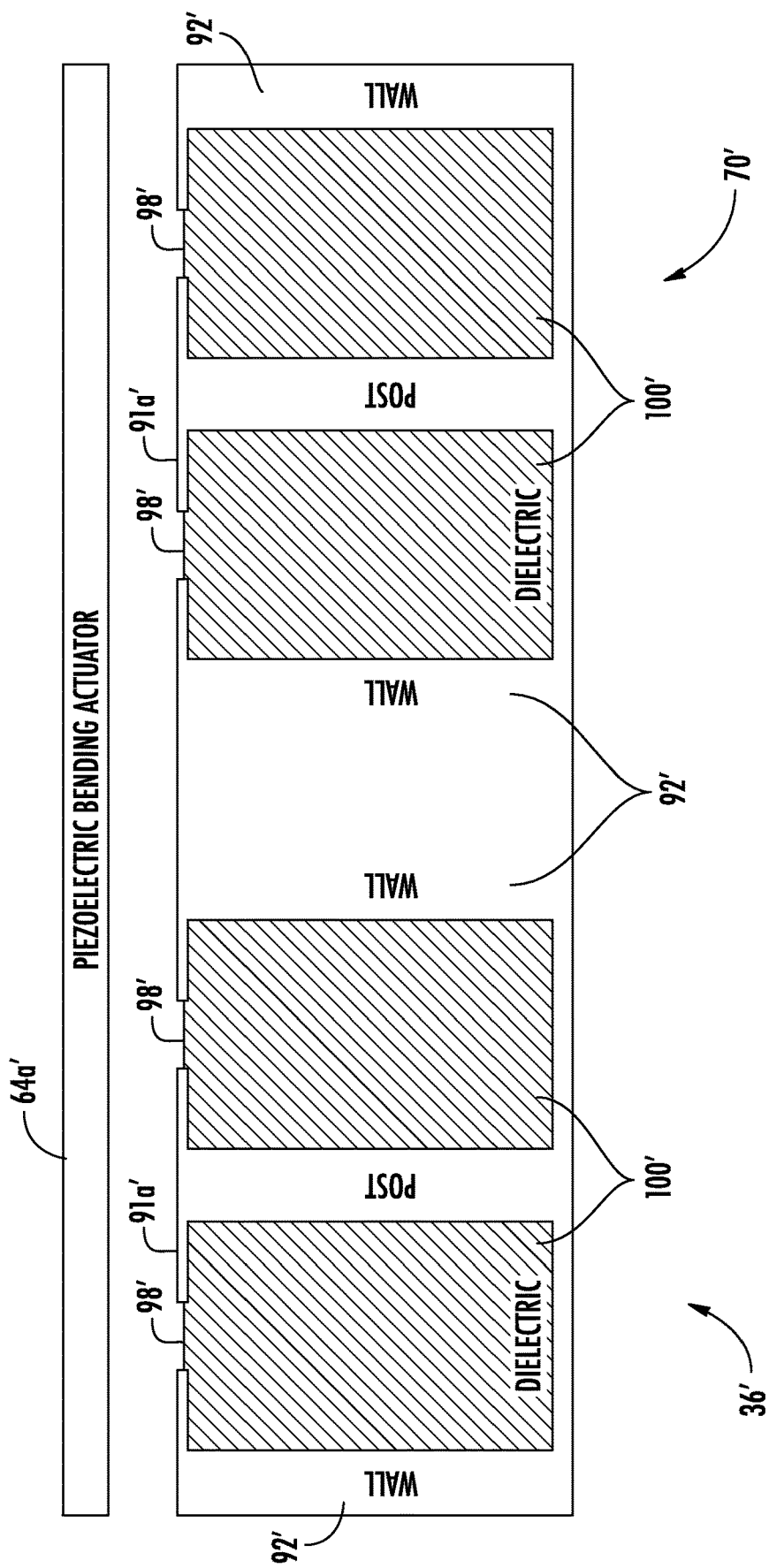
FIG. 10 is a schematic section view of the input tunable cavity impedance matching device and its monitoring cavity device of FIG. 9.

Referring now to FIGS. 8-10, there is illustrated a second embodiment of the first and second input tunable cavity impedance matching devices 36', 38' where a single piezoelectric bending actuator 64a', 64b' is applied over a respective first and second input tunable cavity impedance matching device 36', 38' and the respective first and second input monitoring cavity devices 70', 72'. A similar structure can be used at the first and second output impedance matching devices 42, 44 and respective monitoring cavity devices 74, 76. Vias 94', 95' form the central capacitive post 91' and cavity wall 92' for both the first and second input tunable cavity impedance matching devices 36', 38' and the respective first and second input monitoring cavity devices 70', 72' as described above and explained using a process such as described in the incorporated by reference '709 patent. A single piezoelectric bending actuator 64a' extends across the first input tunable cavity impedance matching device 36' and its first input monitoring cavity device 70', and a second piezoelectric bending actuator 64b' extends across the second input tunable cavity impedance matching device 38' and its second input monitoring cavity device 72'. Constant frequencies may be correlated for different amounts of bending on the piezoelectric bending actuators 64a', 64b'.

Figure 11:
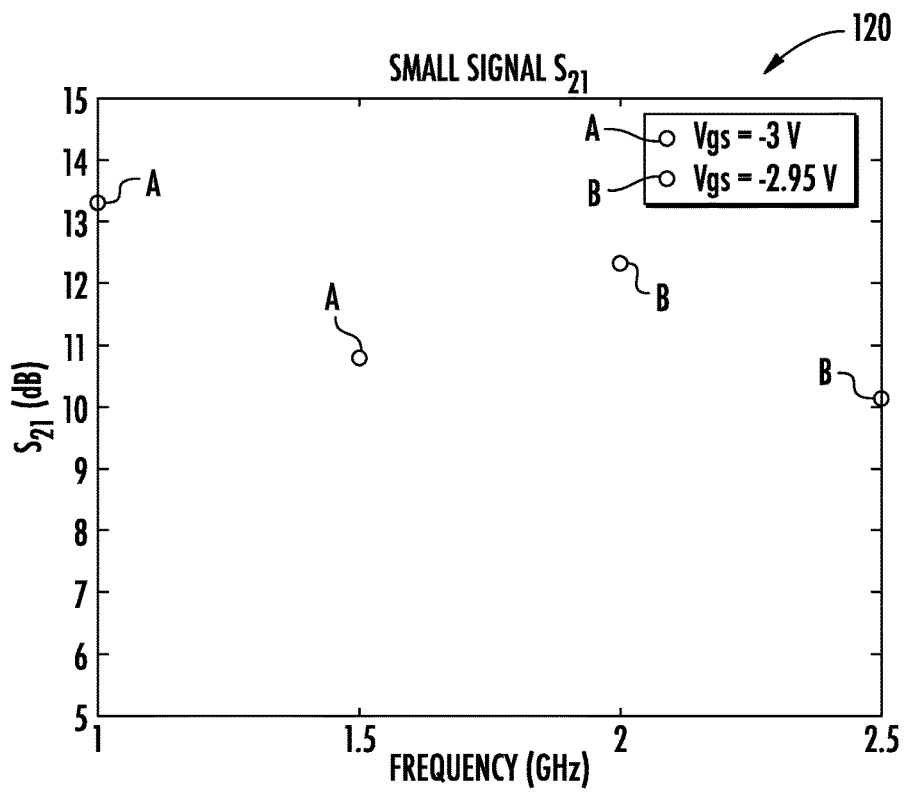
FIG. 11 is a graph of the small signal gain and efficiency for the RF device of FIG. 1.
Figure 12:
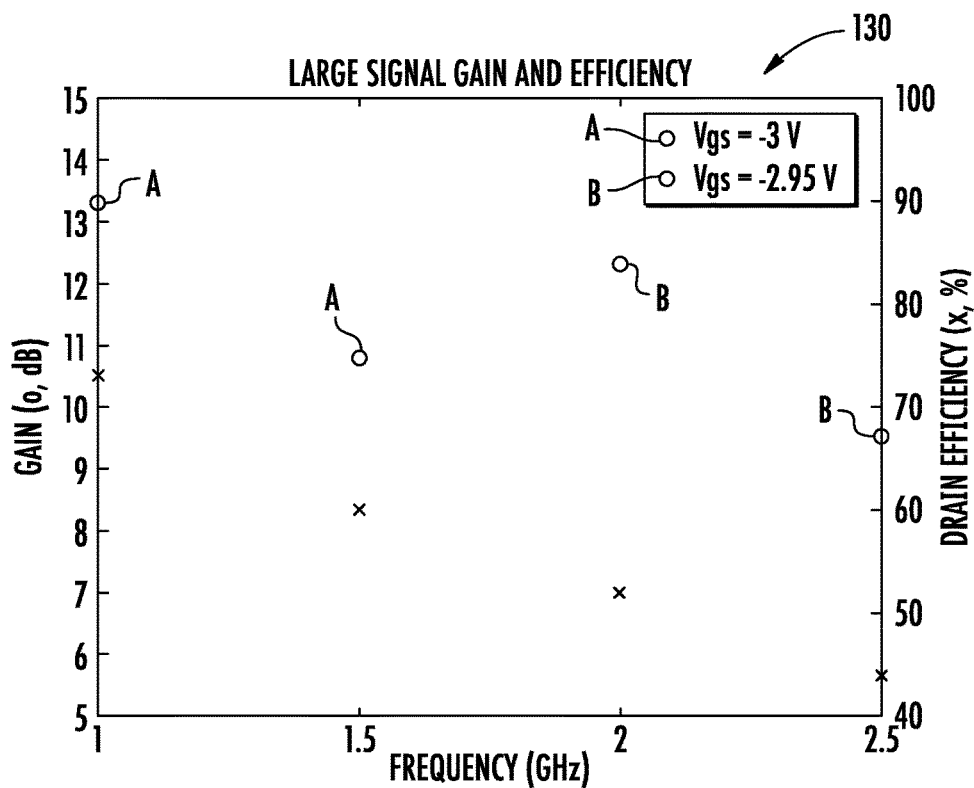
FIG. 12 is a graph of the large signal gain and efficiency of the RF device of FIG. 1.

Referring now to FIG. 11, there is illustrated a graph at 120 of an example simulation and showing small signal gain and the efficiency for the RF device 20 of FIG. 1. FIG. 12 illustrates at 130 a graph as an example simulation for large signal gain and efficiency of the RF device of FIG. 1. Both graphs 120, 130 for the small signal gain and large signal gain demonstrate the simulation results for a gate-source voltage (Vgs) in an example of −3 volts indicated by the "0" labeled A, and −2.95 volts indicated by the "0" labeled B, and showing efficiency gains on both graphs. The frequency is shown as ranging from 1.0 to 2.5 GHz with the gain on the vertical left axis, and drain efficiency on the vertical right axis. As indicated in both graphs, the gain varies between 10 and 13, and as shown in the simulation and displayed on the graphs, at 2.5 GHz for the RF device 20 operation, there is a 68% efficiency, which is considered to be a very high efficiency for power amplifiers, where efficiencies above 50% are considered in many conventional power amplifiers with some wideband characteristics to be excellent.

Figure 13:
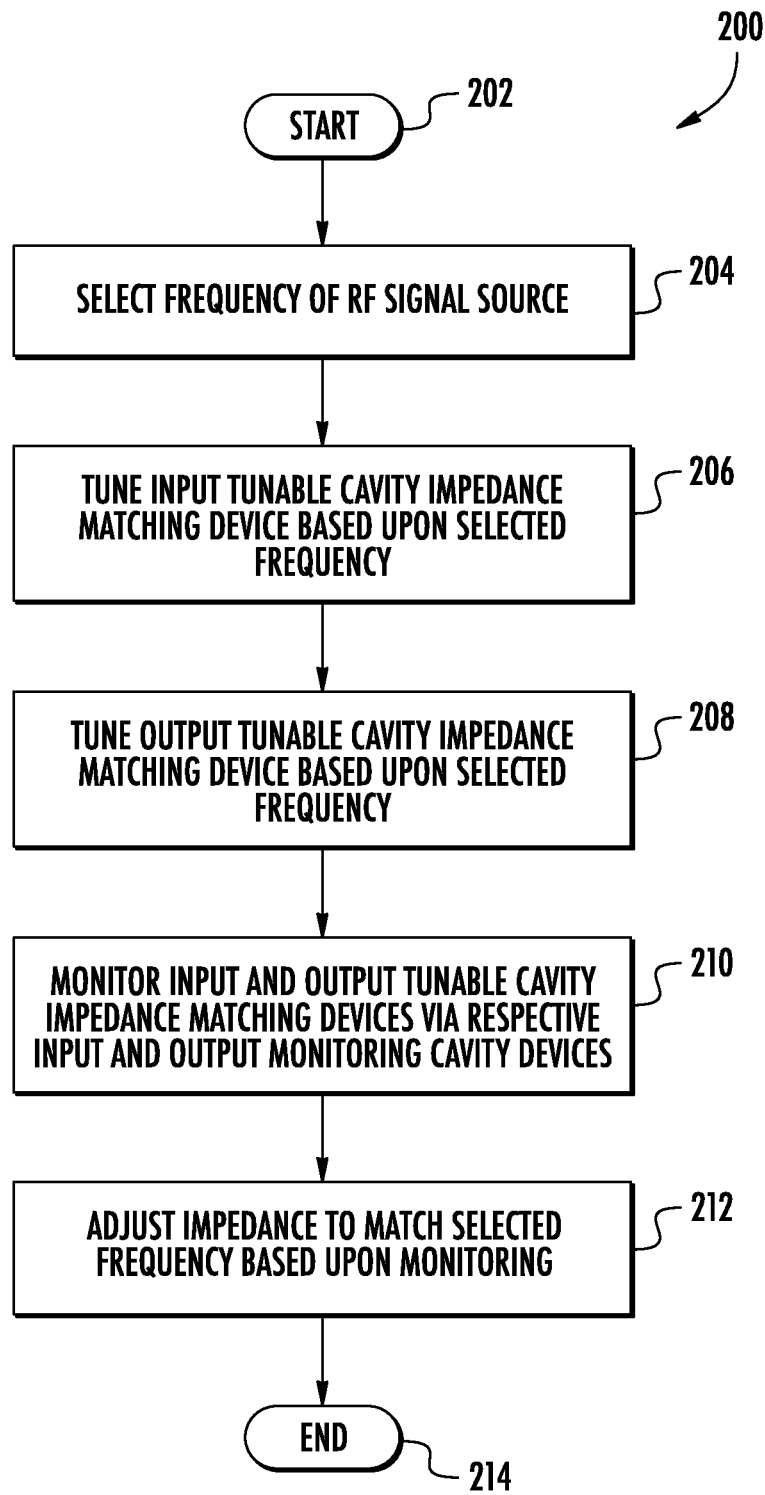
FIG. 13 is a high level flowchart of a method of operating the RF device of FIG. 1.

Referring now to FIG. 13, a high level flowchart of a method of operating the RE device of FIG. 1 is illustrated at 200. The process starts (Block 202) and the controller 60 is operated to select a frequency of the RF signal source 22 (Block 204). At least one input tunable cavity impedance matching device 34 is tuned based upon the selected frequency (Block 206). At least one output tunable cavity impedance matching device is tuned based upon the selected frequency (Block 208). Respective input and output tunable cavity impedance matching devices 36, 38, 42, 44 are monitored by their respective input or output tunable cavity impedance matching devices 70, 72, 74, 76 to determine frequency operation of the cavities (Block 210). The controller 60 makes respective changes by adjusting a respective piezoelectric bending actuator 64 and adjusting impedance at each cavity for proper RF device 20 operation (Block 212). The process ends (Block 214).

The first and second input and output tunable cavity impedance matching devices 36, 38, 42, 44 work in conjunction with the first and second input and output monitoring cavity devices 70, 72, 74, 76 for implementing in this example a transistor impedance matching circuit and manage the proper required impedance matching of each frequency of operation over a range of frequencies, for example, imparting a tuning range of 1:3, which in the examples of the RF device 20 as described above corresponds to a tuning range of about 1 GHz to 3 GHz. However, the configuration of the various cavities and dimensions can be selected so that the 1:3 tuning range could be used to impart a tuning range of 10 to 30 GHz or 30 to 90 GHz, with a selected range being within a 1 to 60 GHz range as long as the 1:3 ratio is met as a design consideration.

It is possible to tune in milliseconds to another frequency, making the RF device 20 operable in frequency hopping applications to hop at a KHz rate to different frequencies. The monitored impedance provides an efficient and high power reconfigurable power amplifier device 20 with a large tuning range. Each frequency selected for the power amplifier device 48 operation may be individually and multi-frequency impedance matched. No switching is required, and thus, there are no RF induced spurs. Each cavity may accommodate a large amount of input and output power, and the RE device 20 may operate up to 100 watts in some examples. Because the RE device 20 may operate efficiently at many different frequencies, it is useful in satellite communications where one RF power amplifier module 30 may be used for two or more frequencies that may be common in satellite communications so that one RF device 20 can be inserted within a single satellite or satellite base station. For example, one RF device 20 may operate within the C band at 4 to 8 GHz and within the X band at 8.0 to 12.0 GHz. The RF device 20 may be manufactured smaller than many standard power amplifier circuit card assemblies and an RF device 20 may substitute for a number of power amplifier modules since it can be formed on a single substrate 54 that can be inserted within small radios, such as software defined radios. The RF device 20 may be implemented for use with all classes of amplifiers, for example, Class A, B or C, and also Class F or Class J impedance matching amplifiers, which may admit imperfections, such as parasitics of the transistor and have high impedance at the harmonics.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A radio frequency (RF) device comprising:
   an RE signal source having a selectable frequency;
   an RF antenna;
   an RF power amplifier module coupled between the RF signal source and the RE antenna, the RF power amplifier module comprising
      at least one input tunable cavity impedance matching device,
      at least one output tunable cavity impedance matching device, and
      a power amplifier device having an input coupled to the at least one input tunable cavity impedance matching device, and having an output coupled to the at least one output tunable cavity impedance matching device; and
   a controller configured to
      select the selectable frequency of the RE signal source,
      tune the at least one input tunable cavity impedance matching device based upon the selected frequency, and
      tune the at least one output tunable cavity impedance matching device based upon the selected frequency.

2. The RF device of claim 1 wherein the RE power amplifier module comprises a substrate and at least one conductive layer thereon; and wherein the power amplifier device is mounted above the at least one conductive layer.

3. The RF device of claim 1 wherein the at least one input tunable cavity impedance matching device comprises first and second input tunable cavity impedance matching devices; and wherein the controller is configured to tune the first input tunable cavity impedance matching device to a fundamental frequency of the selected frequency, and tune the second input tunable cavity impedance matching device to an integer multiple of the fundamental frequency of the selected frequency.

4. The RF device of claim 3 wherein the first and second input tunable cavity impedance matching devices are arranged in series with the second input tunable cavity impedance matching device being closest to the power amplifier device.

5. The RF device of claim 1 wherein the at least one output tunable cavity impedance matching device comprises first and second output tunable cavity impedance matching devices; and wherein the controller is configured to tune the first output tunable cavity impedance matching device to a fundamental frequency of the selected frequency, and tune the second output tunable cavity impedance matching device to an integer multiple of the fundamental frequency of the selected frequency.

6. The RF device of claim 5 wherein the first and second output tunable cavity impedance matching devices are arranged in series with the second output tunable cavity impedance matching device being closest to the power amplifier device.

7. The RF device of claim 1 wherein the at least one input tunable cavity impedance matching device is voltage tunable; and wherein the at least one output tunable cavity impedance matching device is voltage tunable.

8. The RF device of claim 1 comprising at least one input monitoring cavity device coupled to the at least one input tunable cavity impedance matching device.

9. The RF device of claim 1 comprising at least one output monitoring cavity device coupled to the at least one output tunable cavity impedance matching device.

10. A radio frequency (RF) power amplifier module to be coupled between an RE signal source having a selectable frequency and an RF antenna, the RF power amplifier module comprising:
at least one input tunable cavity impedance matching device to be tuned based upon the selected frequency of the RE signal source;
at least one output tunable cavity impedance matching device to be tuned based upon the selected frequency of the RF signal source; and
a power amplifier device having an input coupled to the at least one input tunable cavity impedance matching device, and having an output coupled to the at least one output tunable cavity impedance matching device.

11. The RF power amplifier module of claim 10 comprising a substrate and at least one conductive layer thereon; and wherein the power amplifier device is mounted above the at least one conductive layer.

12. The RF power amplifier module of claim 10 wherein the at least one input tunable cavity impedance matching device comprises first and second input tunable cavity impedance matching devices; and wherein the controller is configured to tune the first input tunable cavity impedance matching device to a fundamental frequency of the selected frequency, and tune the second input tunable cavity impedance matching device to an integer multiple of the fundamental frequency of the selected frequency.

13. The RF power amplifier module of claim 12 wherein the first and second input tunable cavity impedance matching devices are arranged in series with the second input tunable cavity impedance matching device being closest to the power amplifier device.

14. The RF power amplifier module of claim 10 wherein the at least one output tunable cavity impedance matching device comprises first and second output tunable cavity impedance matching devices; and wherein the controller is configured to tune the first output tunable cavity impedance matching device to a fundamental frequency of the selected frequency, and tune the second output tunable cavity impedance matching device to an integer multiple of the fundamental frequency of the selected frequency.

15. The RF power amplifier module of claim 14 wherein the first and second output tunable cavity impedance matching devices are arranged in series with the second output tunable cavity impedance matching device being closest to the power amplifier device.

16. The RF power amplifier module of claim 10 wherein the at least one input tunable cavity impedance matching device is voltage tunable; and wherein the at least one output tunable cavity impedance matching device is voltage tunable.

17. The RF power amplifier module of claim 10 comprising at least one input monitoring cavity device coupled to the at least one input tunable cavity impedance matching device.

18. The RF power amplifier module of claim 10 comprising at least one output monitoring cavity device coupled to the at least one output tunable cavity impedance matching device.

19. A method of operating a radio frequency (RF) device comprising an RF signal source having a selectable frequency, an RF antenna, and an RF power amplifier module coupled therebetween and comprising at least one input tunable cavity impedance matching device, at least one output tunable cavity impedance matching device, and a power amplifier device coupled between the at least one input cavity impedance matching device and the at least one output tunable cavity impedance matching device, the method comprising:
operating a controller to
select a selectable frequency of the RF signal source,
tune the at least one input tunable cavity impedance matching device based upon the selected frequency, and
tune the at least one output tunable cavity impedance matching device based upon the selected frequency.

20. The method of claim 19 wherein the RF power amplifier module comprises a substrate and at least one conductive layer thereon; and wherein the power amplifier device is mounted on the at least one conductive layer.

21. The method of claim 19 wherein the at least one input tunable cavity impedance matching device comprises first and second input tunable cavity impedance matching devices; and the method of operating the controller comprises tuning the first input tunable cavity impedance matching device to a fundamental frequency of the selected frequency, and tuning the second input tunable cavity impedance matching device to an integer multiple of the fundamental frequency of the selected frequency.

22. The method of claim 21 wherein the first and second input tunable cavity impedance matching devices are arranged in series with the second input tunable cavity impedance matching device being closest to the power amplifier device.

23. The method of claim 19 wherein the at least one output tunable cavity impedance matching device comprises first and second output tunable cavity impedance matching devices; and the method of operating the controller comprises tuning the first output tunable cavity impedance matching device to a fundamental frequency of the selected frequency, and tuning the second output tunable cavity impedance matching device to an integer multiple of the fundamental frequency of the selected frequency.

24. The method of claim 23 wherein the first and second output tunable cavity impedance matching devices are arranged in series with the second output tunable cavity impedance matching device being closest to the power amplifier device.

\* \* \* \* \*